United States Patent
Paek et al.

(10) Patent No.: US 9,202,932 B2
(45) Date of Patent: Dec. 1, 2015

(54) SEMICONDUCTOR DEVICES AND METHODS OF MANUFACTURING THE SAME

(71) Applicant: Samsung Electronics Co., Ltd., Suwon-si (KR)

(72) Inventors: Seung-Woo Paek, Yongin-si (KR); Jung-Dal Choi, Hwaseong-si (KR); Young-Seop Rah, Yongin-si (KR); Byung-Kwan You, Seoul (KR); Seok-Won Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 487 days.

(21) Appl. No.: 13/834,529

(22) Filed: Mar. 15, 2013

(65) Prior Publication Data

US 2013/0256781 A1  Oct. 3, 2013

(30) Foreign Application Priority Data

Mar. 27, 2012  (KR) .................. 10-2012-0030880

(51) Int. Cl.
| | |
|---|---|
| H01L 21/3205 | (2006.01) |
| H01L 29/792 | (2006.01) |
| H01L 29/66 | (2006.01) |
| H01L 21/768 | (2006.01) |
| H01L 21/28 | (2006.01) |
| H01L 21/764 | (2006.01) |
| H01L 27/115 | (2006.01) |
| H01L 23/522 | (2006.01) |

(52) U.S. Cl.
CPC ........ *H01L 29/792* (2013.01); *H01L 21/28282* (2013.01); *H01L 21/764* (2013.01); *H01L 21/7682* (2013.01); *H01L 23/5222* (2013.01); *H01L 27/11568* (2013.01); *H01L 29/66833* (2013.01); *H01L 2924/0002* (2013.01)

(58) Field of Classification Search
CPC .................................................... H01L 21/3205
See application file for complete search history.

(56) References Cited

U.S. PATENT DOCUMENTS

| 7,569,465 B2 | 8/2009 | Chen et al. |
| 2009/0127538 A1 | 5/2009 | Ryoo et al. |

FOREIGN PATENT DOCUMENTS

| KR | 1020040056837 | 7/2004 |
| KR | 1020040069849 | 8/2004 |
| KR | 1020080113872 | 12/2008 |
| KR | 1020090050302 | 5/2009 |
| KR | 1020090092927 | 9/2009 |
| KR | 1020100072559 | 7/2010 |

*Primary Examiner* — Marvin Payen
(74) *Attorney, Agent, or Firm* — Meyers Bigel Sibley & Sajovec, P.A.

(57) ABSTRACT

In a method of manufacturing a semiconductor device, a dielectric layer structure and a control gate layer can be formed sequentially on a substrate. The control gate layer can be partially etched to form a plurality of control gates. A gate spacer and a sacrificial spacer sequentially can be stacked on a sidewall of the control gate and on a portion of the dielectric layer structure. The dielectric layer structure can be partially etched using the sacrificial spacer and the gate spacer as an etching mask to form a plurality of dielectric layer structure patterns. The sacrificial spacer can be removed. An insulating interlayer can be formed on the substrate to form an air gap. The insulating interlayer can cover the dielectric layer structure pattern, the gate spacer and the control gate. The air gap can extend between the adjacent gate spacers and between the adjacent dielectric layer structure patterns.

20 Claims, 15 Drawing Sheets

2ND DIRECTION
⊗ ⟶ 1ST DIRECTION

2ND DIRECTION
⊗ ⟶ 1ST DIRECTION

2ND DIRECTION
⊗ ⟶ 1ST DIRECTION

2ND DIRECTION
⊗ ⟵ 1ST DIRECTION

2ND DIRECTION
⊗ ⟵ 1ST DIRECTION

2ND DIRECTION
⊗ — 1ST DIRECTION

2ND DIRECTION
⊗ — 1ST DIRECTION

2ND DIRECTION
⊗ ⟶ 1ST DIRECTION

2ND DIRECTION
⊗ ⟶ 1ST DIRECTION

2ND DIRECTION
⊗ ⟶ 1ST DIRECTION

2ND DIRECTION
⊗ ⟶ 1ST DIRECTION

2ND DIRECTION
⊗ ⟶ 1ST DIRECTION

2ND DIRECTION
⊗ ⟶ 1ST DIRECTION

SEMICONDUCTOR DEVICES AND METHODS OF MANUFACTURING THE SAME

CROSS-REFERENCE TO RELATED APPLICATIONS

This application claims priority under 35 USC §119 to Korean Patent Application No. 10-2012-0030880 filed on Mar. 27, 2012 in the Korean Intellectual Property Office (KIPO), the contents of which are herein incorporated by reference in their entirety.

BACKGROUND

1. Field

Example embodiments relate to semiconductor devices and methods of manufacturing the same. More particularly, example embodiments relate to semiconductor devices having air gaps and methods of manufacturing the same.

2. Description of the Related Art

As semiconductor devices have become more highly integrated, a distance between gate structures or between word lines may be reduced. Accordingly, a parasitic capacitance or a cell coupling may occur between the gate structures or the word lines, and thus a threshold voltage may adequately affect the reliability of semiconductor devices.

A charge-trapping type non-volatile memory device includes a dielectric layer structure having a tunnel insulation layer, a charge-trapping layer and a blocking layer sequentially stacked n each other, and a plurality of gate electrodes on the dielectric layer structure. Due to high-k characteristics of the dielectric layer structure, a cell coupling may not be sufficiently prevented even though an air gap is formed between the adjacent gate electrodes. To expand the air gap under a bottom surface of the gate electrode, the dielectric layer structure between the gate electrodes may be etched.

SUMMARY

Example embodiments can provide a method of manufacturing a semiconductor device including an air gap.

According to example embodiments, there is provided a method of manufacturing a semiconductor device. A dielectric layer structure and a control gate layer are sequentially formed sequentially on a substrate. The control gate layer is partially etched to form a plurality of control gates. A gate spacer and a sacrificial spacer sequentially stacked on a sidewall of the control gate and on a portion of the dielectric layer structure are formed. The dielectric layer structure is partially etched using the sacrificial spacer and the gate spacer as an etching mask to form a plurality of dielectric layer structure patterns. The sacrificial spacer is removed. An insulating interlayer is formed on the substrate to form an air gap. The insulating interlayer covers the dielectric layer structure pattern, the gate spacer and the control gate. The air gap extends between the adjacent gate spacers and between the adjacent dielectric layer structure patterns.

In example embodiments, the dielectric layer structure may include a tunnel insulation layer, a charge trapping layer and a blocking layer sequentially stacked on the substrate.

In example embodiments, the dielectric layer structure may be partially etched until an upper portion of the tunnel insulation is removed.

In example embodiments, the dielectric layer structure may be partially etched until a top surface of the substrate is exposed.

In example embodiments, an upper portion of the substrate may be further etched after partially etching the dielectric layer structure.

In example embodiments, in the formation of the gate spacer and the sacrificial spacer, a gate spacer layer covering the control gates may be formed on the dielectric layer structure. A sacrificial layer may be formed on the gate spacer layer. The sacrificial layer and the gate spacer layer may be partially etched to form the sacrificial spacer and the gate spacer, respectively. The gate spacer may be formed on the sidewall of the control gate and on the portion of the dielectric layer structure, the sacrificial spacer may be formed on the gate spacer.

In example embodiments, partially etching the sacrificial layer and the gate spacer layer may be performed by an anisotropic etching process or an etch-back process.

In example embodiments, the gate spacer layer may be formed using silicon nitride 10 or silicon oxynitride, and the sacrificial layer may be formed using silicon oxide.

In example embodiments, the sacrificial spacer may be removed by a wet etching process in which an etching Solution having an etching selectivity for the silicon oxide is used.

In example embodiments, a width of the control gate may be smaller than a width of a top surface of the dielectric layer structure pattern.

In example embodiments, the air gap may include an upper portion between the adjacent gate spacers and a lower portion between the adjacent dielectric layer structure patterns. The upper portion may have a width smaller than a width of the lower portion.

According to example embodiments, there is provided a semiconductor device. The semiconductor device includes a dielectric layer structure pattern, a control gate, a gate spacer and an insulating interlayer. A plurality of the dielectric layer structure patterns is disposed on a substrate. The control gate is disposed on a top surface of the dielectric layer structure pattern. The control gate has a width smaller than a width of the top surface of the dielectric layer structure pattern. The gate spacer is disposed on a sidewall of the control gate and on the top surface of the dielectric layer structure pattern. The insulating interlayer covers the dielectric layer structure pattern, the control gate and the gate spacer. The insulating interlayer includes an air gap therein. The air gap includes. an upper portion between the adjacent gate spacers and a lower portion between the adjacent dielectric layer structure patterns. A width of the upper portion is larger than a width of the lower portion.

In example embodiments, the gate spacer may have an L-shape.

In example embodiments, the dielectric layer structure pattern may include a tunnel insulation layer pattern, a charge trapping layer pattern and a blocking layer pattern sequentially stacked on the substrate.

In example embodiments, the tunnel insulation layer pattern may have a linear shape including a plurality of stepped portions, and the charge trapping layer pattern and the blocking layer pattern may be disposed on the stepped portion.

In some embodiments, a non-volatile semiconductor memory device can include a gap on a substrate, where the gap includes an upper gap portion and a lower gap portion between an upper surface of the substrate and the upper gap portion, and where the upper gap portion can be wider than the lower gap portion. Directly adjacent dielectric layer structure patterns can be on the substrate and spaced apart from one another by the lower gap portion and directly adjacent control gates can be on the directly adjacent dielectric layer structure patterns opposite the substrate, where the directly adjacent control gates can be spaced apart from one another by the upper gap portion.

In some embodiments a gate spacer can be on facing sidewalls of each of the directly adjacent control gates and on an uppermost surface of the dielectric layer structure pattern. In some embodiments, the lower gap portion can extend along facing sidewalls of the directly adjacent dielectric layer structure patterns to beyond an uppermost surface of the substrate located beneath the directly adjacent control gates.

In some embodiments, the gap comprises a "T" shaped air gap. In some embodiments, the lower gap portion can extends along facing sidewalls of the directly adjacent dielectric layer structure patterns to beyond an uppermost surface of the directly adjacent dielectric layer structure patterns located beneath the directly adjacent control gates.

According to example embodiments, a dielectric layer structure including a blocking layer, a charge trapping layer and a tunnel insulation layer between adjacent control gates may be etched so that an air gap may extend under a bottom surface of the control gate. Before the etching process, a gate spacer may be formed on the control gate so that a distance between a sidewall of the control gate and an etching surface of the dielectric layer structure may be increased. Thus, a back tunneling phenomenon may be prevented from being accelerated through the etching surface of the dielectric layer structure. Additionally, a sacrificial spacer may be formed on the gate spacer so that the distance between the sidewall of the control gate and the etching surface of the dielectric layer structure may be further increased. The sacrificial spacer may be removed after the etching process so that a space for defining the air gap may be sufficiently achieved.

BRIEF DESCRIPTION OF THE DRAWINGS

Example embodiments will be more clearly understood from the following detailed 4 description taken in conjunction with the accompanying drawings. FIGS. 1A to 20 represent non-limiting, example embodiments as described herein.

FIG. 1A to 1C are cross-sectional views illustrating semiconductor devices in accordance with example embodiments;

FIGS. 3 to 11 are cross-sectional views illustrating methods of manufacturing semiconductor devices in accordance with example embodiments;

FIGS. 12 and 19 are cross-sectional views illustrating methods of manufacturing 10 semiconductor devices in accordance with example embodiments; and FIG. 20 is a block diagram illustrating a schematic construction of a computing system in accordance with example embodiments.

DETAILED DESCRIPTION OF THE EMBODIMENTS

Figure 1A:
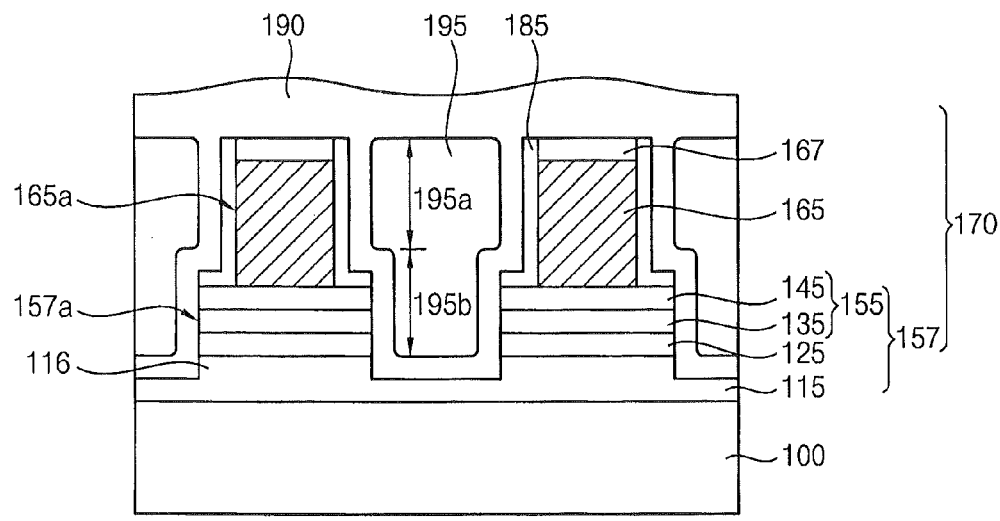

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening .elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although "air gaps" are described herein in embodiments according to the inventive concept, any gap may be used according to embodiments of the inventive concept. A gap may be defined, for example, as any void or cavity, and may be a gap filled with air (e.g., an air gap), a gap filled with an inert gas or gases (e.g., an inert gas gap), a gap defining a vacuum (e.g., a vacuum gap), etc. As appreciated by the present inventive entity, the gap may help reduce parasitic capacitance due to coupling between immediately adjacent gate structures by reducing dielectric material therebetween.

Hereinafter, example embodiments will be explained in detail with reference to the accompanying drawings.

Figure 1B:
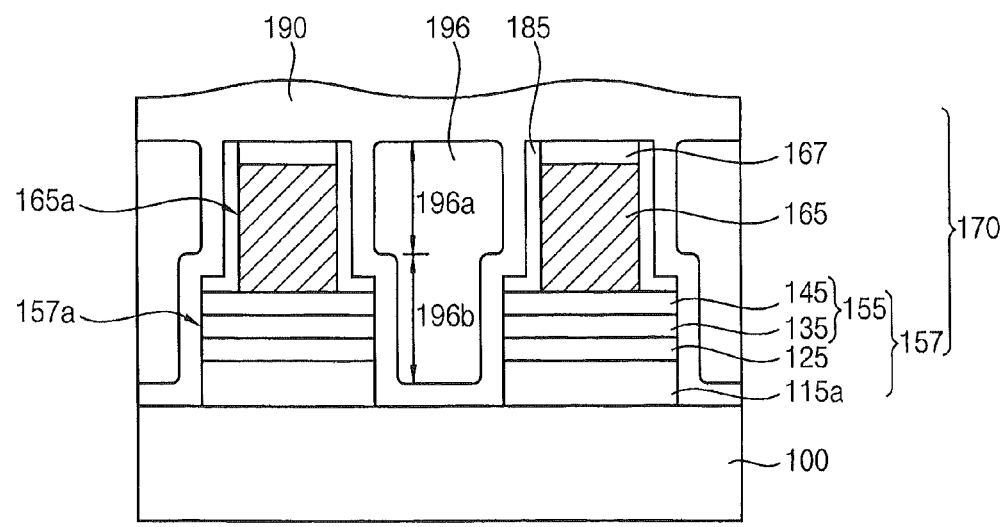

FIG. 1A to 1C are cross-sectional views illustrating semiconductor devices in accordance with example embodiments. In example embodiments, the semiconductor device may be a charge-trapping type memory device.

Referring to FIG. 1A, the semiconductor device may include a gate structure 170 and an insulating interlayer 190 on a substrate 100. The insulating interlayer 190 may cover the gate structure 170.

In example embodiments, a plurality of gate structures 170 may be disposed regularly in a first direction, each of which may extend in a second direction substantially perpendicular to the first direction. An air gap 195 may be formed in the insulating interlayer 190 between the adjacent gate structures 170.

The substrate 100 may include a semiconductor substrate. For example, the substrate 100 may include a silicon substrate, a germanium substrate, a silicon-germanium substrate, a silicon-on-insulator (SOI) substrate, a germanium-on-insulator (GOI) substrate, or the like. The substrate 100 may be divided into an active region and a field region by an isolation layer extending in the first direction. In example embodiments, a plurality of isolation layers may be arranged in the second direction.

The gate structure 170 may include a tunnel insulation layer pattern 115, a charge trapping layer pattern 125, a blocking layer pattern 155, a control gate 165 and a gate mask 167 sequentially stacked on the substrate 100.

The tunnel insulation layer pattern 115 may be disposed in the active region of the substrate 100. The tunnel insulation layer pattern 115 may include a material having a relatively low dielectric constant, e.g., silicon oxide, an oxynitride such as silicon oxynitride, silicon oxide doped with impurities, or the like.

The charge trapping layer pattern 125 may be disposed on the tunnel insulation layer pattern 115. The charge trapping layer pattern 125 may include silicon nitride, silicon oxynitride or a metal oxide such as hafnium silicon oxide, aluminum oxide, or the like.

The blocking layer pattern 155 may be disposed on the charge trapping layer pattern 125. The blocking layer pattern 155 may include a metal oxide having a relatively high dielectric constant, e.g., hafnium oxide, titanium oxide, tantalum oxide, zirconium oxide, aluminum oxide, lanthanum oxide, strontium oxide, or the like. In example embodiments, the blocking layer pattern 155 may have a stacked structure including a first blocking layer pattern 135 and a second blocking layer pattern 145. The first blocking layer pattern 135 and the second blocking layer pattern 145 may include a metal oxide different from each other.

As illustrated in FIG. 1A, the tunnel insulation layer pattern 115 may extend continuously in the first direction. Thus, the tunnel insulation layer pattern 115 may cover the active region of the substrate 100 to prevent the active region from being damaged due to, for example, an etching process. The tunnel insulation layer pattern 115 may include a stepped portion 116 protruding vertically with respect to a top surface of the substrate 100. In example embodiments, a plurality of stepped portions 116 may be formed regularly in the first direction. The charge trapping layer pattern 125 and the blocking layer pattern 155 may be disposed on the stepped portion 116.

Hereinafter, a structure including the tunnel insulation layer pattern 115, the charge trapping layer pattern 125 and the blocking layer pattern 155 may be referred to as a dielectric layer structure pattern 157.

The control gate 165 may be disposed on the dielectric layer structure pattern 157. In example embodiments, the control gate 165 may be disposed on a top surface of the blocking layer pattern 155. The control gate 165 may extend in the second direction and may serve as a word line of the semiconductor device. The control gate 165 may include a metal or a metal nitride such as titanium nitride, tantalum nitride, or the like.

In example embodiments, a width of the control gate 165 may be smaller than a width of the top surface of the dielectric layer structure pattern 157 in the first direction. Accordingly, a sidewall 165a of the control gate 165 may be spaced apart from a sidewall 157a of the dielectric layer structure pattern 157 by a given distance. Therefore, a back tunneling phenomenon that may be accelerated from the control gate 165 to the sidewall 157a of the dielectric layer structure pattern 157 may be blocked or reduced.

The gate mask 167 may be disposed on the control gate 165. The gate mask 167 may include, e.g., silicon nitride or silicon oxynitride.

A gate spacer 185 may be formed on sidewalls of the gate mask 167 and the control gate 165 and on the blocking layer pattern 155. In example embodiments, the gate spacer 185 may have a substantial "L" shape. The gate spacer 185 may extend in the second direction like the control gate 165. The gate spacer 185 may include, e.g., silicon nitride.

The insulating interlayer 190 may be formed on the substrate 100 to cover the gate structures 170. The insulating interlayer 190 may include silicon oxide having poor step coverage such as tetra ethyl ortho silicate (TEOS), plasma enhanced-tetra ethyl ortho silicate (PE-TEOS), undoped silicate glass (USG), or the like.

The air gap 195 may be formed in the insulating interlayer 190 between the adjacent gate structures 170. The air gap 195 may extend in the second direction. In example embodiments, the air gap 195 may include an upper portion 195a and a lower portion 195b having widths in the second direction that are different from each other. The upper portion 195a of the air gap 195 may be formed substantially between the adjacent gate spacers 185, and the lower portion 195b of the air gap 195 may be formed substantially between the adjacent dielectric layer structure patterns 157.

In example embodiments, the width of the upper portion 195a of the air gap 195 may be larger than that of the lower portion 195b of the air gap 195b. For example, the air gap 195 may have a substantially hammer (or "T") shape in which the upper portion 195a and the lower portion 195b may correspond to a head and a grip, respectively.

According to example embodiments, a cell coupling or a parasitic capacitance occurring between the adjacent control gates 165 may be reduced by the upper portion 195a of the air gap 195. Additionally, a breakdown voltage occurring when the dielectric layer structure pattern 157 extends continuously in the first direction may be blocked by the lower portion 195b of the air gap 195, so that a leakage current between the adjacent gate structures 170 may be reduced. In example embodiments, the width of the upper portion 195a of the air gap 195 may be larger than that of the lower portion of the air gap 195 to sufficiently block the cell coupling between the adjacent control gates 165.

Referring to FIG. 1B, a plurality of tunnel insulation layer patterns 115a may be spaced apart from each other along the first direction. In this case, a lower portion 196b of an air gap 196 may extend more closely to the top surface of the substrate 100. Therefore, the air gap 196 between the adjacent dielectric layer structure patterns 157 may have an increased volume relative to the air gap 195.

Referring to FIG. 1C, an upper portion of the substrate 100 between the adjacent tunnel insulation layer patterns 115a may be partially recessed. In this case, a lower portion 197b of an air gap 197 may extend under the upper surface of the substrate 100 beneath the gate structures 170.

Figure 2A:
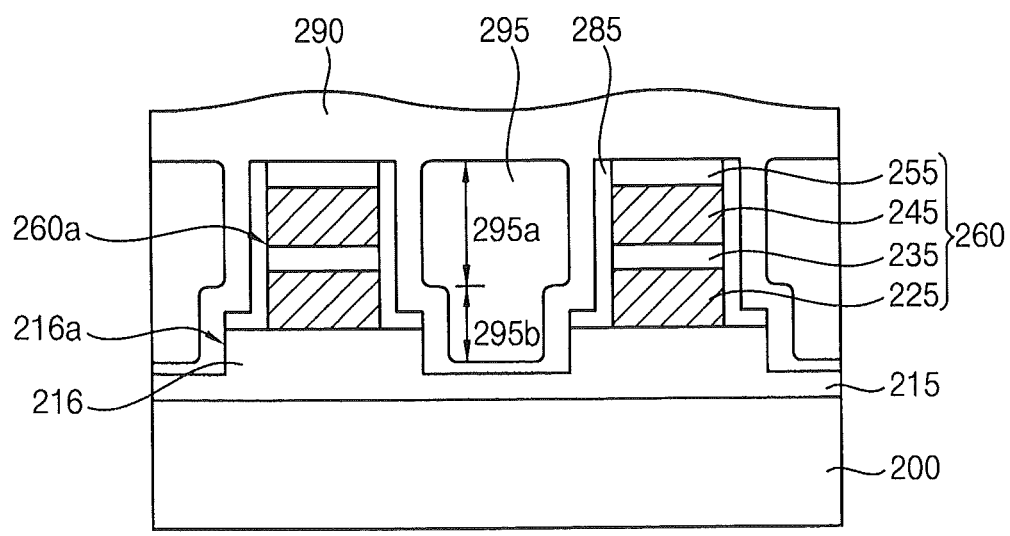
FIGS. 2A to 2C are cross-sectional views illustrating semiconductor devices in accordance with example embodiments.
Figure 2B:
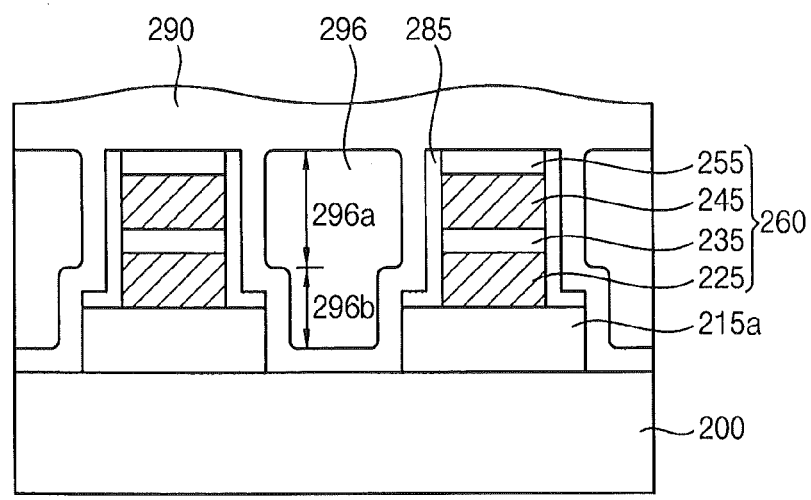
Figure 2C:
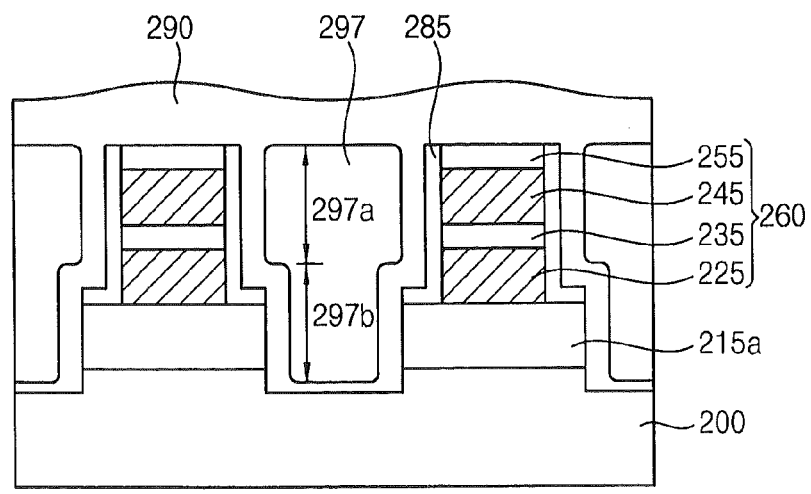

FIGS. 2A to 2C are cross-sectional views illustrating semiconductor devices in accordance with example embodiments. For example, the semiconductor devices may be floating-gate type memory devices.

Referring to FIG. 2A, the semiconductor device may include a tunnel insulation layer pattern 215 formed on a substrate 200, a gate pattern 260 on the tunnel insulation layer pattern 215, a gate spacer 285 and an insulating interlayer 290.

The tunnel insulation layer pattern 215 may include, for example, silicon oxide. In example embodiments, the tunnel insulation layer pattern 215 may extend continuously in the first direction and may include a plurality of stepped portions 216 arranged regularly in the first direction.

The gate pattern 260 may be disposed on the stepped portion 216 of the tunnel insulation layer pattern 215. The gate pattern 260 may include a floating gate 225, a dielectric layer pattern 235, a control gate 245 and a hard mask 255. In example embodiments, a plurality of gate patterns 260 may be arranged on the stepped portions 216 regularly in the first direction, each of which may extend in the second direction.

In example embodiments, a width of the gate pattern 260 in the first direction may be smaller than that of the stepped portion 216 of the tunnel insulation layer pattern 215 in the first direction. Thus, a sidewall 260a of the gate pattern 260 may be space apart from a sidewall 216a of the stepped portion 216 in the first direction.

The floating gate 225 may include a metal having a high work function such as tungsten, titanium, cobalt and/or nickel, or polysilicon doped with impurities.

The dielectric layer pattern 235 may have an oxide-nitride-oxide (ONO) layer structure. Alternatively, the dielectric layer pattern 235 may include a metal oxide having a high dielectric constant, e.g., hafnium oxide, titanium oxide, zirconium oxide, aluminum oxide, or the like. These may be used alone or in a combination thereof.

The control gate 245 may include, for example, doped polysilicon, a metal, a metal nitride, a metal silicide, or the like.

The hard mask 255 may include, for example, silicon nitride or silicon oxynitride.

The gate spacer 285 may be formed along the sidewall 260a of the gate pattern 260 and a top surface of the stepped portion 216 of the tunnel insulation layer pattern 215. In example embodiments, the gate spacer 285 may have a substantial "L" shape.

The insulating interlayer 290 may be formed on the substrate 200 to cover the gate pattern 260 and the gate spacer 285. The air gap 295 may be formed in the insulating interlayer 290 between the adjacent gate patterns 260 and between the adjacent stepped portions 216. In example embodiments, the air gap 295 may include an upper portion 295a and a lower portion 295b having a width smaller than that of the upper portion 295a. The upper portion 295a of the air gap 295 may be formed substantially between the adjacent gate spacers 285, and the lower portion 295b of the air gap 295 may be formed substantially between the adjacent stepped portions 216.

Referring to FIG. 2B, a plurality of tunnel insulation layer patterns 215a may be spaced apart from each other along the first direction. In this case, a lower portion 296b of an air gap 296 may extend more closely to an upper surface of the substrate 200. Therefore, the air gap 296 between the tunnel insulation layer patterns 215a may have an increased volume compared to the air gap 295.

Referring to FIG. 2C, the upper surface of the substrate 200 between the adjacent tunnel insulation layer patterns 215a may be partially recessed. In this case, a lower portion 297b of an air gap 297 may extend under the upper surface of the substrate 200 beneath the gate structures 260.

FIGS. 3 to 11 are cross-sectional views illustrating methods of manufacturing semiconductor devices in accordance with example embodiments. For example, FIGS. 3 to 11 illustrate methods of manufacturing charge-trapping type memory devices.

Figure 3:
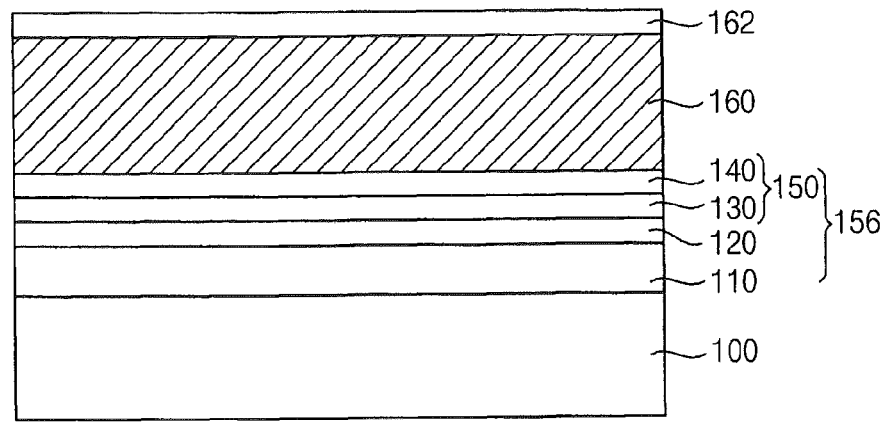

Referring to FIG. 3, a tunnel insulation layer 110, a charge trapping layer 120, a blocking layer 150, a control gate layer 160 and a gate mask layer 162 may be sequentially formed on a substrate 100.

The substrate 100 may be a semiconductor substrate such as a silicon substrate, a germanium substrate, an SOI substrate, a GOI substrate, or the like. The substrate 100 may further include a well having p-type or n-type impurities. The substrate 100 may be divided into an active region and a field region by an isolation layer. In example embodiments, a plurality of isolation layers may be formed regularly in a second direction, each of which may extend in a first direction substantially perpendicular to the second direction.

The tunnel insulation layer 110 may be formed using an oxide such as silicon oxide, an oxynitride such as silicon oxynitride, silicon oxide doped with impurities, or the like. The tunnel insulation layer 110 may be formed by a chemical vapor deposition (CVD) process, a low pressure chemical vapor deposition (LPCVD) process, a plasma enhanced chemical vapor deposition (PECVD) process, a spin coating process, or the like. Alternatively, the tunnel insulation layer 110 may be formed by a thermal oxidation process on the substrate 100.

The charge trapping layer 120 may be formed using silicon nitride or silicon oxynitride in which charges may be trapped or stored. The charge trapping layer 120 may be also formed using a metal oxide, e.g., hafnium silicon oxide, aluminum oxide, or the like. The charge trapping layer 120 may be formed by a CVD process, a PECVD process, an LPCVD process, a physical vapor deposition (PVD) process, or the like.

The blocking layer 150 may be formed using a metal oxide that may have a relatively high dielectric constant, e.g., hafnium oxide, titanium oxide, tantalum oxide, zirconium oxide, aluminum oxide, lanthanum oxide, strontium titanium oxide, or the like. In example embodiments, the blocking layer 150 may have a stacked structure including a first blocking layer 130 and a second blocking layer 140 that may contain a metal oxide different 5 from each other. The blocking layer 150 may be formed by a CVD process, a PECVD process, an LPCVD process, a PVD process, or the like.

Hereinafter, a multi-layered structure including the tunnel insulation layer 110, the charge trapping layer 120 and the blocking layer 150 may be referred to as a dielectric layer structure 156.

The control gate layer 160 may be formed using a metal or a metal nitride such as titanium nitride, tantalum nitride, or the like. The control gate layer 160 may be formed by a CVD process, a PVD process, a sputtering process, an atomic layer deposition (ALD) process, or the like.

The gate mask layer 162 may be formed using silicon nitride or silicon oxynitride by a CVD process, a PECVD process, an LPCVD process, a spin coating process, or the like.

In an example embodiment, a plurality of hard masks each of which may extend in the first direction may be formed in a second direction substantially perpendicular to the first direction on the tunnel insulation layer 110. The tunnel insulation layer 110 and an upper portion of the substrate 100 may be partially removed using the hard masks as an etching mask such that trenches may be formed at the upper portion of the substrate 100. The trenches may extend in the first direction and may be spaced apart from each other along the second direction.

The isolation layers filling the trenches may be formed using, e.g., silicon oxide. As mentioned above, the substrate 100 may be divided into the active region and the field region by the isolation layers. The tunnel insulation layer 110 may extend in the first direction on the active region of the substrate 100.

Figure 4:
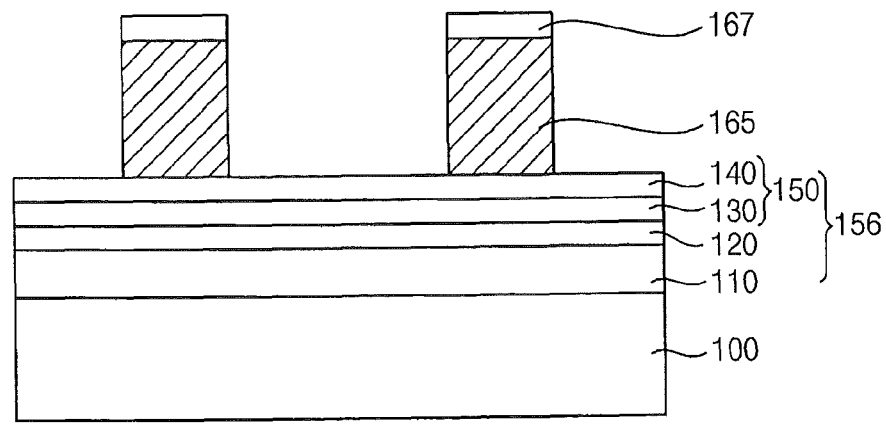

Referring to FIG. 4, the gate mask layer 162 may be partially etched by, for example, a photolithography process to form a gate mask 167. The control gate layer 160 may be partially etched using the gate mask 167 as an etching mask to form a control gate 165. In example embodiments, the gate mask 167 and the control gate 165 may have a linear shape extending in the second direction.

Figure 5:
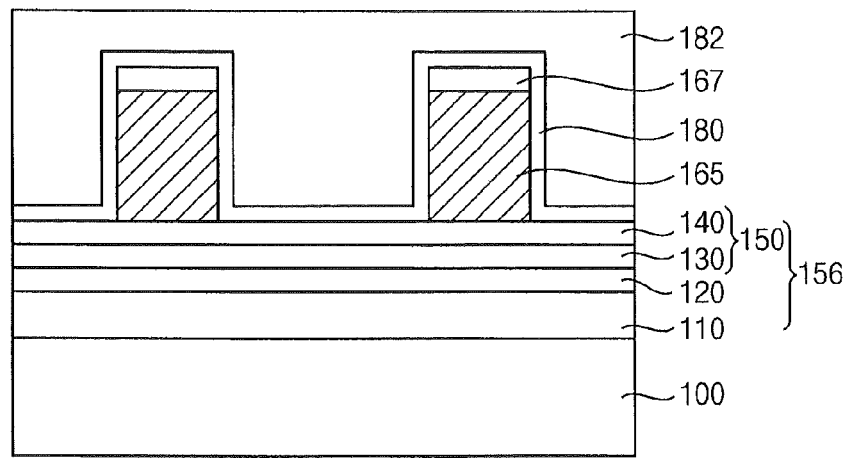

Referring to FIG. 5, a gate spacer layer 180 covering the control gate 165 and the gate mask 167 may be formed on the blocking layer 150, and then a sacrificial layer 182 may be formed on the gate spacer layer 180.

In example embodiments, the gate spacer layer 180 may be formed using silicon nitride or silicon oxynitride. As illustrated in FIG. 5, the gate spacer layer 180 may be formed conformally on a top surface of the blocking layer 150 and a sidewall of the control gate 165, and on the gate mask 167.

The sacrificial layer 182 may be formed using silicon oxide by a CVD process, a PECVD process, or the like. In example embodiments, the sacrificial layer 182 may sufficiently fill spaces between the adjacent control gates 165 and between the adjacent gate masks 167.

Figure 6:
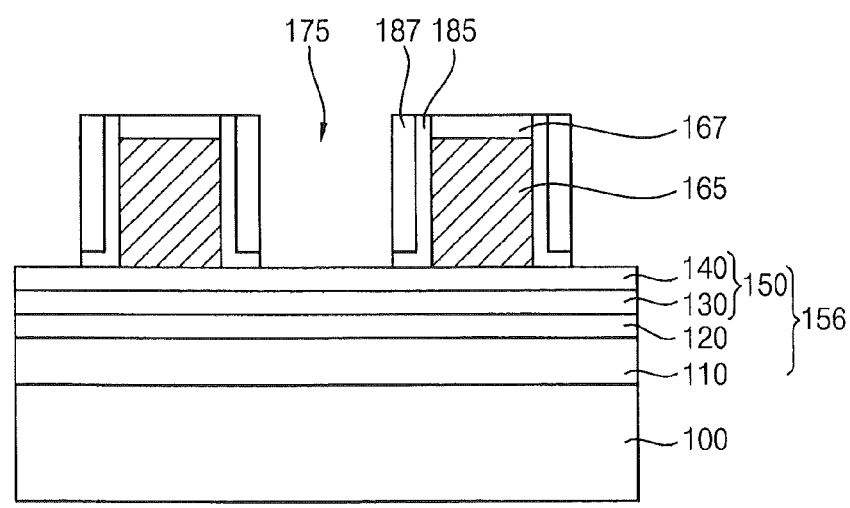

Referring to FIG. 6, the sacrificial layer 182 and the gate spacer layer 180 may be partially removed by an anisotropic etching process or an etch-back process. Accordingly, a gate spacer 185 may be formed on sidewalls of the control gate 165 and the gate mask 167 and on a portion of the blocking layer 150. A sacrificial spacer 187 may be formed on the gate spacer 185. In example embodiments, the gate spacer 185 may have a substantial "L" shape.

A first opening 175 partially exposing the blocking layer 150 may be formed between the adjacent sacrificial spacers 187.

Figure 7A:
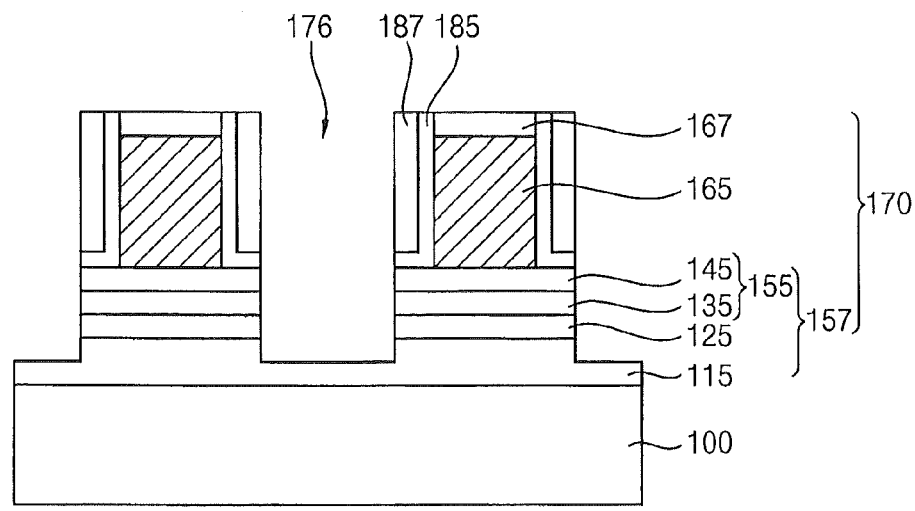

Referring to FIG. 7A, the dielectric layer structure 156 may be partially etched using the sacrificial spacer 187 and the gate spacer 185 as an etching mask, Accordingly, the first opening 175 may be expanded in a direction substantially perpendicular to a top surface of the substrate 100 to form a second opening 176. The etching process may include a dry etching process.

As illustrated in FIG. 7A, the etching process may be carried out until an upper portion of the tunnel insulation layer 110 may be removed. A portion of the tunnel insulation layer 110 exposed during the etching process may not be completely removed, so that defects such as a spike may be prevented from occurring at an upper portion of the substrate 100.

As described above, the dielectric layer structure 156 may be partially etched to form a dielectric layer structure pattern 157 including a tunnel insulation layer pattern 115, a charge trapping layer pattern 125 and a blocking layer pattern 155. In example embodiments, the blocking layer pattern 155 may include a first blocking layer pattern 135 and a second blocking layer pattern 145. Hereinafter, a structure including the dielectric layer structure pattern 157, the control gate 165 and the gate mask 167 may be referred to as a gate structure 170.

The dielectric layer structure 156 may be partially etched such that the second opening 176 may extend to the upper portion of the tunnel insulation 110 in FIG. 7A. However, a depth of the second opening 176 may not be limited as illustrated in FIG. 7A. For example, the etching process may be carried out until the exposed blocking layer 150 may be partially or entirely removed. Further, the etching process may be carried out until the exposed charge trapping layer 120 may be partially or entirely removed. The depth of the second opening 176 may be adjusted according to an end point of the etching process.

Figure 7B:
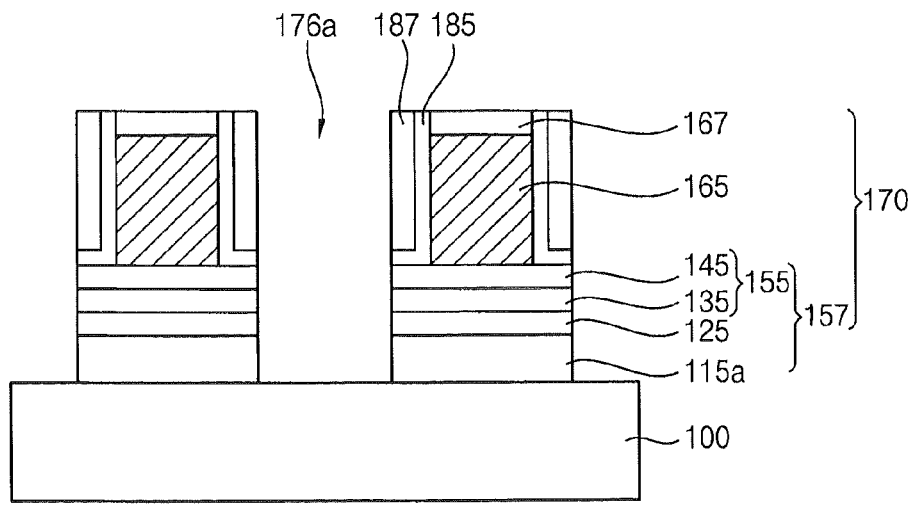

In example embodiments, the etching process may be carried out until the exposed portion of the tunnel insulation layer 110 may be entirely removed as illustrated in FIG. 7B. In this case, an upper surface of the substrate 100 may be partially exposed by a second opening 176a, and a plurality of tunnel insulation patterns 115a may be regularly arranged along the first direction to be spaced apart from each other.

Figure 7C:
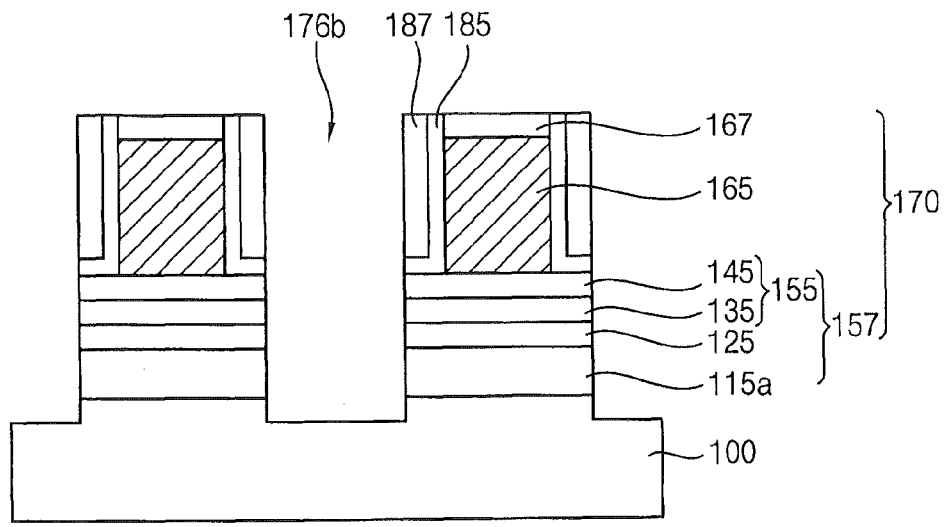

In example embodiments, an upper portion of the substrate 100 exposed by the second opening 176a (see FIG. 7B) may be additionally etched to form a second opening 176b extending under the upper surface of the substrate 100 as illustrated in FIG. 7C.

As illustrated in FIGS. 7B and 7C, a second opening 176 of FIG. 7A may be expanded to increase a depth of an air gap as described below.

Hereinafter, subsequent processes are described with reference to the structure 10 illustrated in FIG. 7A.

Figure 8:
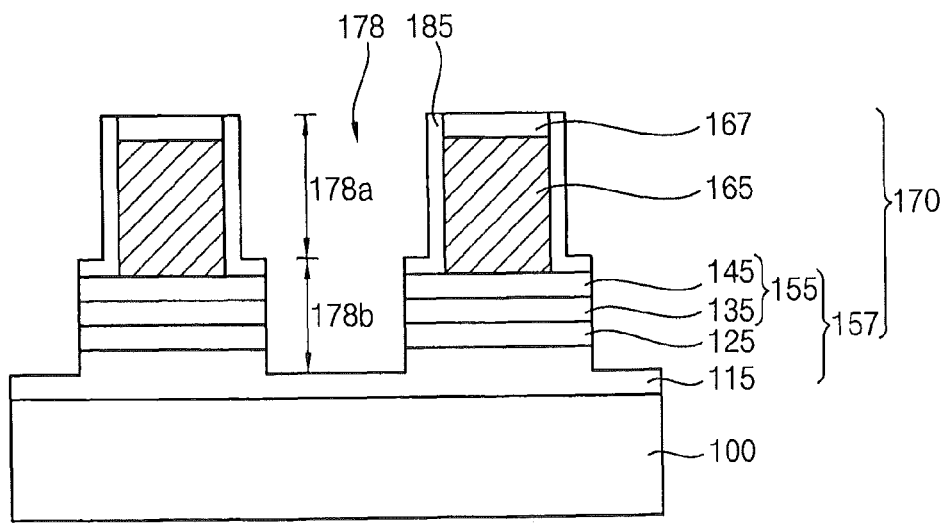

Referring to FIG. 8, the sacrificial spacer 187 may be removed to form a third opening 178. In example embodiments, the sacrificial spacer 187 may be removed by a wet etching process. An etching solution having an etching selectivity for silicon oxide with respect to the gate spacer 185 including silicon nitride or silicon oxynitride may be utilized during the wet etching process. The etching solution may include, e.g., a hydrofluoric acid solution or a buffer oxide etchant (BOE) solution.

The sacrificial spacer 187 may be removed such that the third opening 178 may have a larger width between the adjacent gate spacers 185 than a width of the second opening 176. The third opening 178 may include an upper portion 178a and a lower portion 178b. The upper portion 178a may be formed substantially between the adjacent gate spacers 185. The lower portion 178b may be formed substantially between the adjacent dielectric layer structure patterns 157 and may have a smaller width than that of the upper portion 178a.

Figure 9:
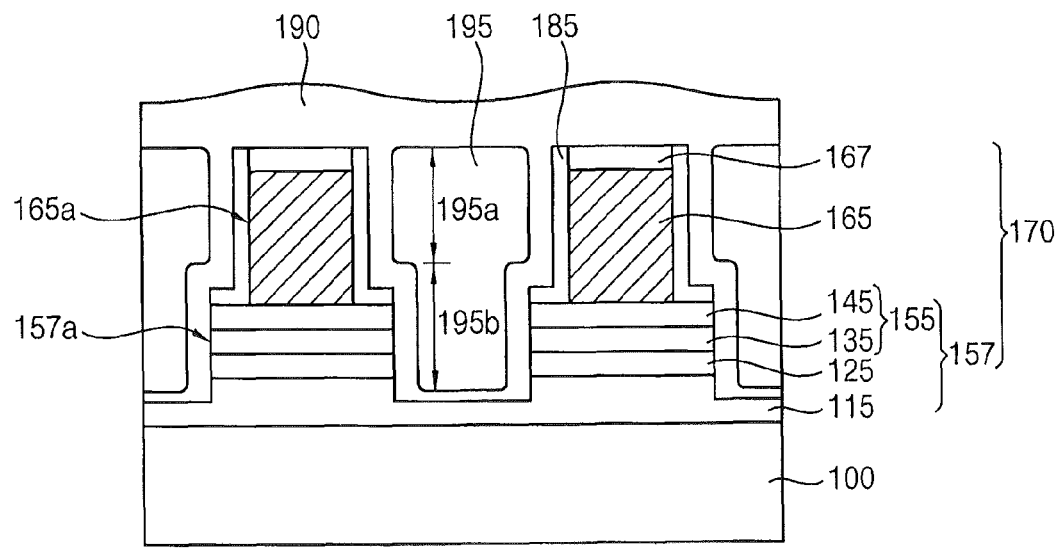

Referring to FIG. 9, an insulating interlayer 190 covering the gate structures 170 and the gate spacers 185 may be formed on the substrate 100. An air gap 195 may be formed in the insulating interlayer 190 between the adjacent gate structures 170. In example embodiments a plurality of air gaps 195 each of which may extend in the second direction may be formed along the first direction.

The insulating interlayer 190 may be formed using silicon oxide having a poor step coverage such as TEOS, PE-TEOS, USG, or the like, such that the air gap 195 may be formed therein. The insulating interlayer 190 may be formed by, e.g., a CVD process, a PECVD process, an LPCVD process, or the like.

In example embodiments, the insulating interlayer 190 may be formed using a material having a lower dielectric constant than that of silicon oxide so that a parasitic capacitance or a cell coupling between the adjacent gate structures 170 may be decreased. For example, the insulating interlayer 190 may be formed using SiOF, SiOC, SiBN, SiBCN, or the like. These may be used alone or in a mixture thereof. Process conditions including temperature, pressure and partial pressures of oxygen and silicon in a chamber for the CVD process, PECVD process or the LPCVD process may be controlled to lower the step coverage so that the air gap 195 may be formed between the adjacent gate structures 170.

In example embodiments, the air gap 195 may have an upper portion 195a and a lower portion 195b having different widths from each other according to the shape of the third opening 178. The upper portion 195a of the air gap 195 may be formed substantially between the adjacent gate spacers 185, and the lower portion 195b of the air gap 195 may have the smaller width than that of the upper portion 195a and may be formed substantially between the adjacent dielectric layer structure patterns 157. For example, the air gap 195 may have a substantial hammer (or "T") shape in which the upper portion 195a and the lower portion 195b may correspond to a head and a grip, respectively.

In example embodiments, a cell coupling or a parasitic capacitance occurring between the adjacent control gates 165 may be prevented by the upper portion 195a of the air gap 195. Additionally, a breakdown voltage occurring when the dielectric layer structure pattern 157 extends continuously in the first direction may be blocked by the lower portion 195b of the air gap 195, so that a leakage current between the adjacent gate structures 170 may be reduced.

In example embodiments, the gate spacer 185 and the sacrificial spacer 187 may be formed on a sidewall 165a of the control gate 165, and then the dielectric layer structure 156 may be etched as described in FIG. 7A. Accordingly, the sidewall 165a of the control gate 165 and a sidewall 157a of the dielectric layer structure pattern 157 may be spaced apart from each other along the first direction. Therefore, a back tunneling acceleration from the control gate 165 to an etching surface of the dielectric layer structure pattern 157, i.e., the sidewall 157a may be reduced.

Further, the sacrificial spacer 187 may be selectively removed after forming the dielectric layer structure pattern 157, so that a space for forming the air gap 195 between the adjacent control gates 165 may be sufficiently achieved. Accordingly, the air gap 195 may include the upper portion 195a having the width larger than that of the lower portion 195b, so that the parasitic capacitance and/or the cell coupling between the control gates 165 may be efficiently blocked.

In example embodiments, the depth of the air gap may become larger than illustrated in FIG. 9.

Figure 10:
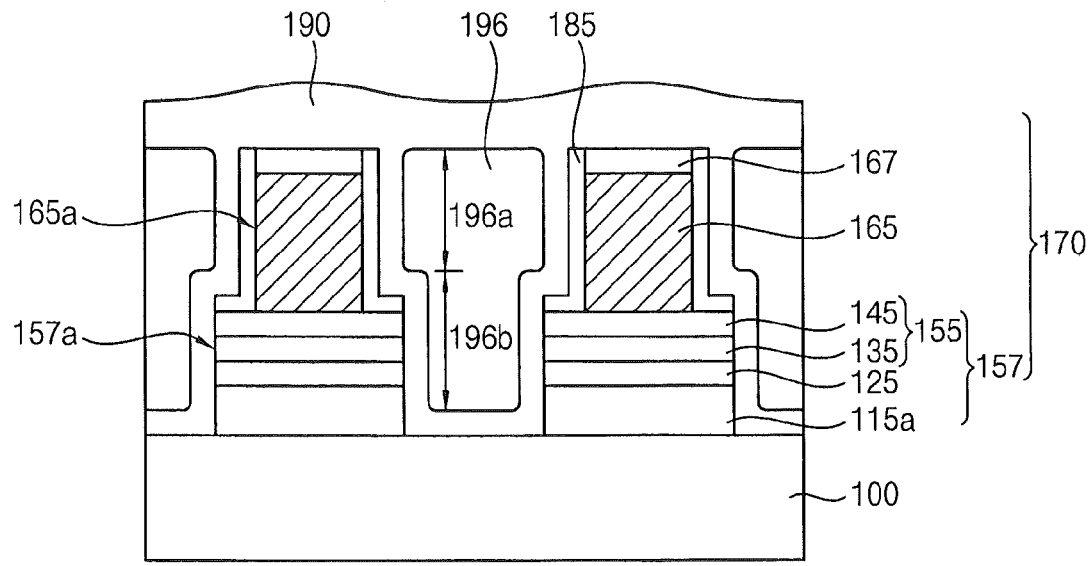

Referring to FIG. 10, when the top surface of the substrate 100 is exposed by the second opening 176a as illustrated in FIG. 7B, a lower portion 196b of an air gap 196 may be expanded more closely to the substrate 100.

Figure 11:
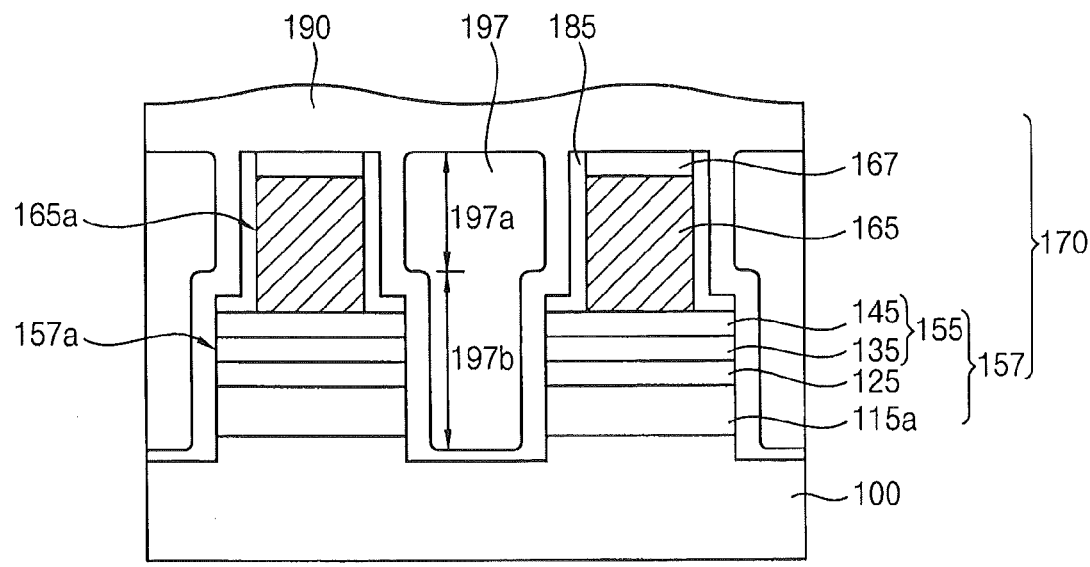

Referring to FIG. 11, when the second opening 176b extends into the upper portion of the substrate 100 as illustrated in FIG. 7C, a lower portion 197b of an air gap 197 may extend beyond the upper surface of the substrate 100. Accordingly, the air gap 197 may be formed between the adjacent tunnel insulation layer patterns 115a sufficiently, so that a leakage current between the adjacent dielectric layer structure patterns 157 may be efficiently reduced.

Additional processes for forming wiring structures (not illustrated) such as a bit line, a common source line (CSL), etc., may be performed to obtain the semiconductor devices according to example embodiments.

Figure 12:
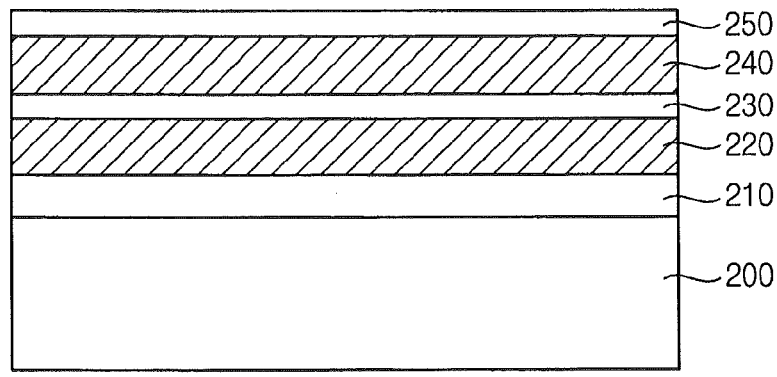
Figure 18:
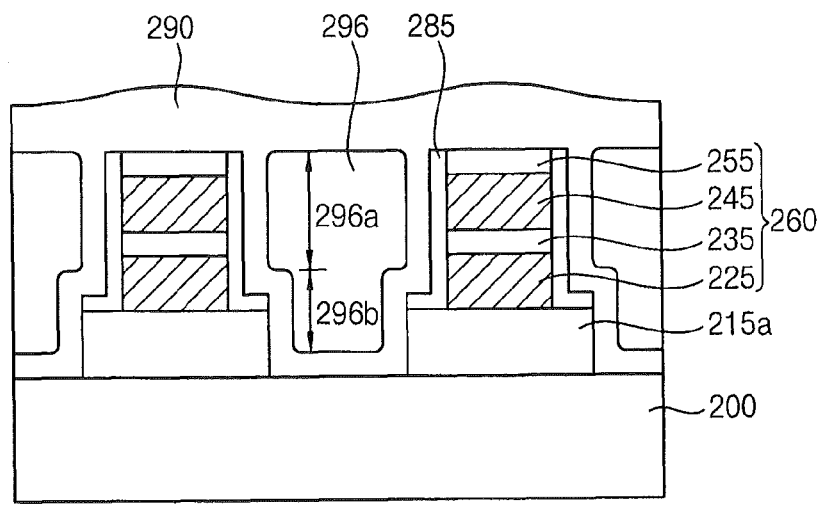
Figure 19:
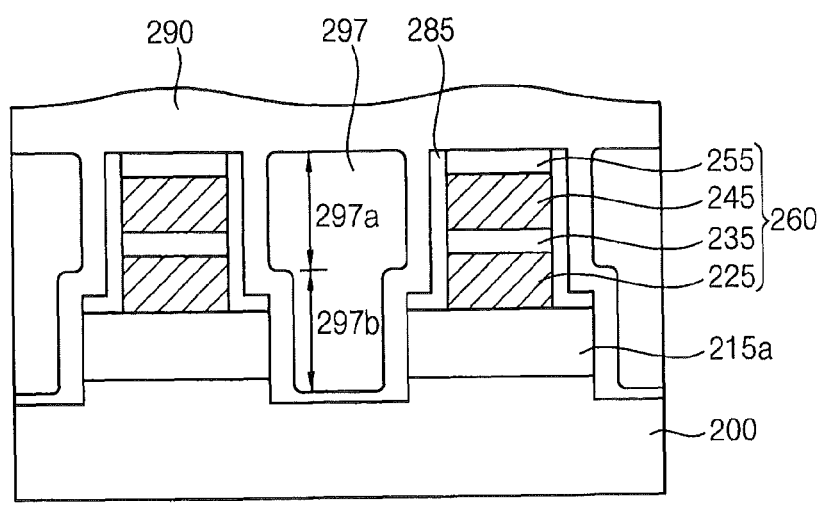

FIGS. 12 and 19 are cross-sectional views illustrating methods of manufacturing semiconductor devices in accordance with example embodiments. For example, FIGS. 12 to 19 illustrate methods of manufacturing floating-gate type memory devices.

Referring to FIG. 12, a tunnel insulation layer 210, a floating gate layer 220, a dielectric layer 230, a control gate layer 240 and a hard mask layer 250 may be sequentially formed on a substrate 200.

The floating gate layer 220 may be formed using polysilicon doped with impurities. For example, polysilicon may be deposited on the tunnel insulation layer 210 by a CVD process, a LPCVD process, or the like, to form a polysilicon layer. N-type impurities may be doped into the polysilicon layer to obtain the floating gate layer 220. Alternatively, the floating gate layer 220 may be formed using a metal having a high work function such as tungsten, titanium, cobalt, nickel, or the like. In this case, the floating gate layer 220 may be formed by a PVD process, a sputtering process, an ALD process, a CVD process, or the like.

The dielectric layer 230 may be formed using an oxide and a nitride to have a multi-layered ONO structure. Alternatively, the dielectric layer 230 may be formed using a metal oxide having a high dielectric constant to increase a capacitance and reduce a leakage current. Examples of the metal oxide may include hafnium oxide, titanium oxide, tantalum oxide, zirconium oxide, aluminum oxide, or the like. These may be used alone or in a mixture thereof. The dielectric layer 230 may be formed by a CVD process, a PECVD process, a LPCVD process, an HDP-CVD process, or the like.

The control gate layer 240 may be formed using polysilicon, a metal, a metal nitride, a metal silicide, or the like, by, e.g., a PVD process, a sputtering process, an ALD process or a CVD process. In example embodiments, the control gate layer 240 may have a stacked structure of a polysilicon layer and a metal layer. In example embodiments, the control gate layer 240 may include doped polysilicon in at least an upper portion thereof.

The hard mask layer 250 may be formed using silicon nitride or silicon oxynitride by, for example, a CVD process, a PECVD process, an LPCVD process or a spin coating process.

Figure 13:
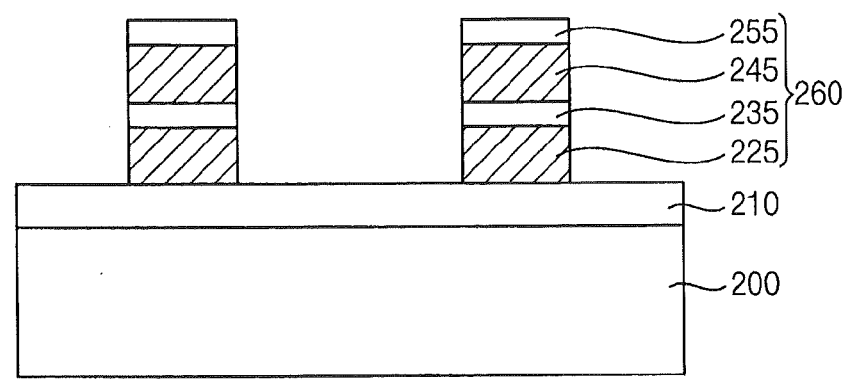

Referring to FIG. 13, the hard mask layer 250, the control gate layer 240, the dielectric layer 230 and the floating gate layer 220 may be sequentially etched by, for example, a photolithography process. Accordingly, a floating gate 225, a dielectric layer pattern 235, a control gate 245 and a hard mask 255 may be formed sequentially on the tunnel insulation layer 210.

For example, the hard mask layer 250 may be partially etched by a photolithography process to form the hard mask 255 on the control gate layer 240. The control gate layer 240, the dielectric layer 230 and the floating gate layer 220 may be partially etched using the hard mask 255 as an etching mask. The tunnel insulation layer 210 may not be etched to protect the substrate 200. In some example embodiments, the control gate layer 240 and the dielectric layer 230 may be partially etched, and then the floating gate layer 220 may be partially etched by a wet etching process or a dry etching process in which an etching solution or an etching gas having a very low etching selectivity with respect to the tunnel insulation layer 210 may be used. In example embodiments, an upper portion of the tunnel insulation layer 210 may be partially removed.

Accordingly, a gate pattern 260 including the floating gate 225, the dielectric layer pattern 235, the control gate 245 and the hard mask 255 sequentially stacked on each other may be formed on the tunnel insulation layer 210. In example embodiments, a plurality of gate patterns 260 may be arranged regularly in a first direction, and each gate pattern 260 may extend in a second direction substantially perpendicular to the first direction.

Figure 14:
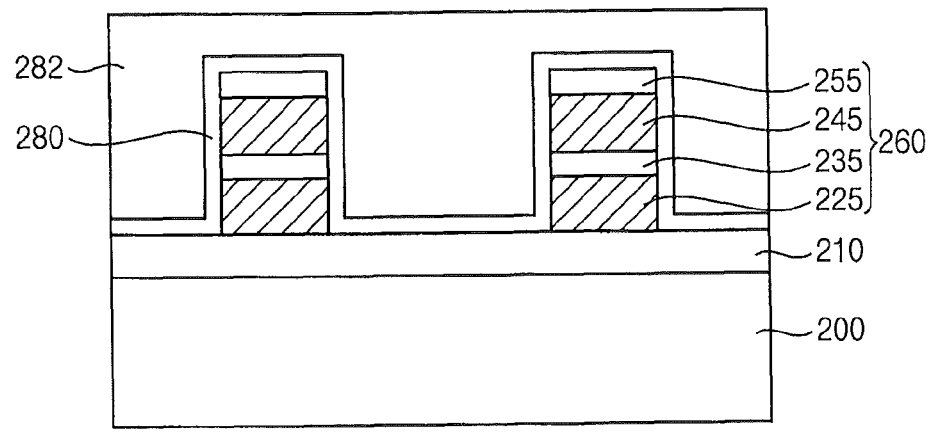

Referring to FIG. 14, a process substantially the same as or similar to that illustrated with reference to FIG. 5 may be performed such that a gate spacer layer 280 covering the gate patterns 260 may be formed on the tunnel insulation layer 210 and the sacrificial layer 282 may be formed on the gate spacer layer 280. The gate spacer layer 280 may be formed using silicon nitride or silicon oxynitride, and the sacrificial layer 282 may be formed using silicon oxide. The sacrificial layer 282 may be formed to sufficiently fill spaces between the gate patterns 260.

Figure 15A:
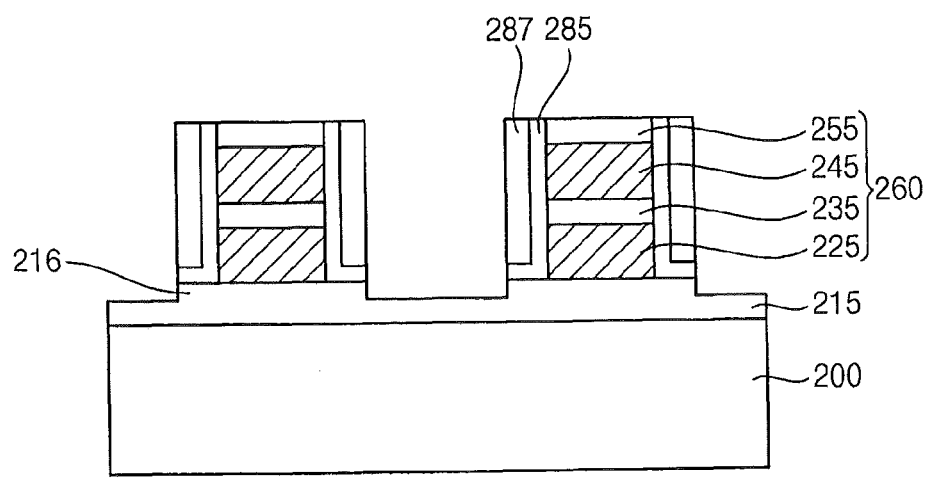

Referring to FIG. 15A, a process substantially the same as or similar to that illustrated with reference to FIG. 6 may be performed. In example embodiments, the sacrificial layer 282 and the gate spacer layer 280 may be partially etched by an anisotropic etching process or an etch-back process. Accordingly, a gate spacer 285 may be formed on a sidewall of the gate pattern 260 and on a portion of a top surface of the tunnel insulation layer 210, and a sacrificial spacer 287 may be formed on the gate spacer 285. In example embodiments, the gate spacer 285 may have a substantially "L" shape extending in the second direction.

An upper portion of the tunnel insulation layer 210 may be partially removed during the anisotropic etching process or the etch-back process to form a tunnel insulation layer pattern 215. In this case, the tunnel insulation layer pattern 215 may continuously extend in the first direction and may include a plurality of stepped portions 216 arranged regularly along the first direction. The gate pattern 260 and the gate spacer 285 may be located on the stepped portions 216.

Figure 15B:
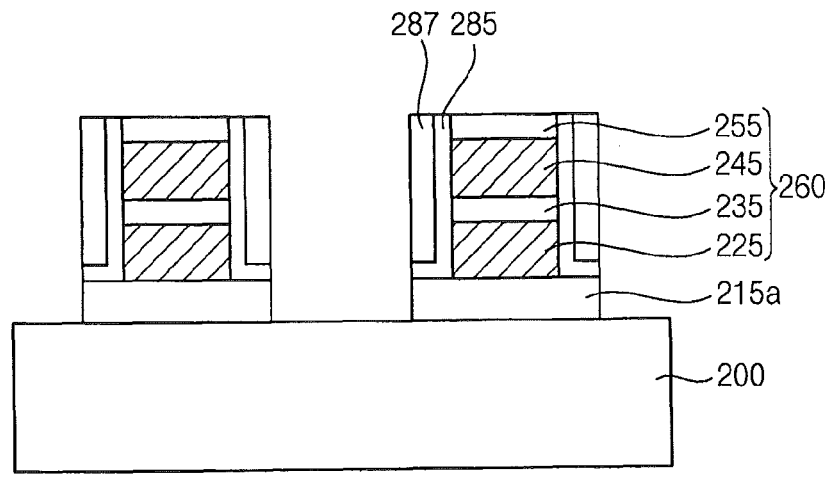

In some example embodiments, a portion of the tunnel insulation layer 210 between the gate spacers 285 that may be exposed during the anisotropic etching process or the etch-back process may be entirely removed as illustrated in FIG. 15B. In this case, a plurality of tunnel insulation layer patterns 215a that may be spaced apart from each other in the first direction may be formed. An upper surface of the substrate 200 may be exposed between the adjacent tunnel insulation layer patterns 215a.

In some example embodiments, an upper portion of the substrate 200 exposed between the adjacent tunnel insulation layer patterns 215a may be additionally etched. Accordingly, a space for forming an air gap between the gate patterns 260 by subsequent processes may be further expanded.

Hereinafter, subsequent processes are described with reference to the structure illustrated in FIG. 15A.

Figure 16:
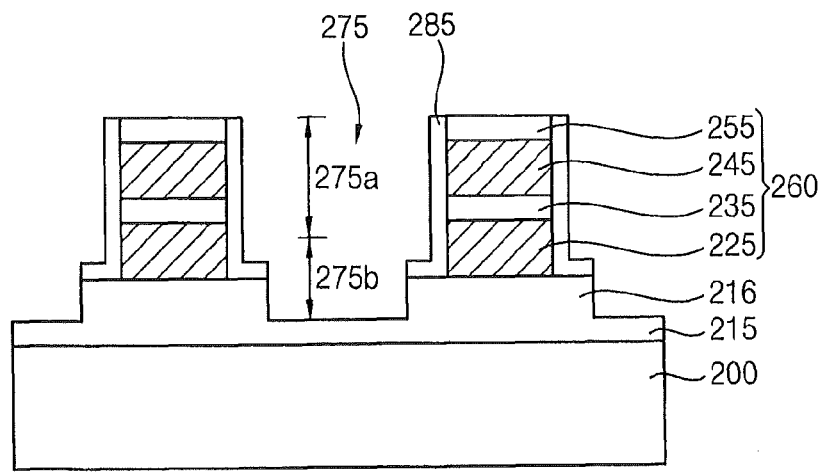

Referring to FIG. 16, a process substantially the same as or similar to that illustrated with reference to FIG. 8 may be performed to remove the sacrificial spacer 287. Accordingly, an opening 275 may be formed between the adjacent gate spacers 285 and between the adjacent stepped portions 216 of the tunnel insulation layer patterns 215. The opening 275 may include an upper portion 275a and a lower portion 275b. The upper portion 275a may be formed substantially between the adjacent gate spacers 285, and the lower portion 275b may be formed substantially between the adjacent stepped portions 216 of the tunnel insulation layer patterns 215. In example embodiments, the upper portion 275a may have a larger width than that of the lower portion 275b.

Figure 17:
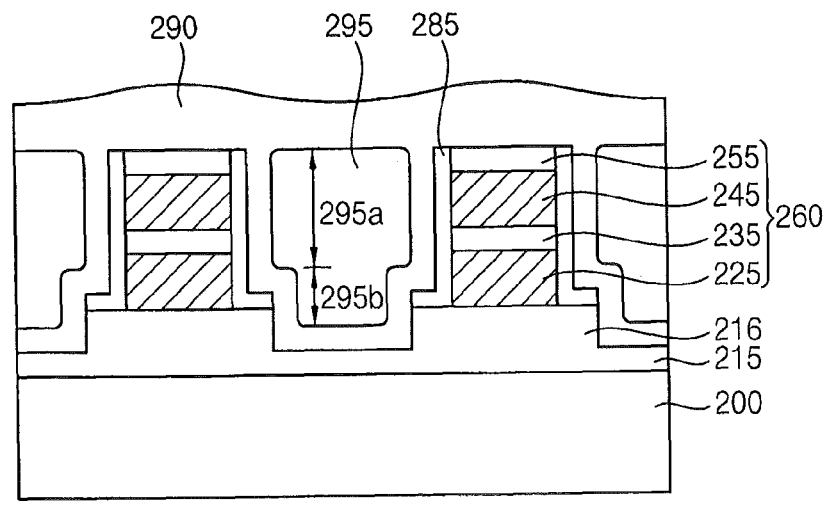

Referring to FIG. 17, a process substantially the same as or similar to that illustrated with reference to FIG. 9 may be performed to form an insulating interlayer 290 covering the gate patterns 260 and the gate spacers 285 on the tunnel insulation layer pattern 215. The insulating interlayer 290 may include an air gap 295 therein between the adjacent gate spacers 285 and between the adjacent stepped portions 216.

In example embodiments, the air gap 295 may include an upper portion 295a and a lower portion 295b having different widths from each other according to the shape of the opening 275. The upper portion 295a of the air gap 295 may be formed substantially between the adjacent gate spacers 285, and the lower portion 295b of the air gap 295 having the width smaller than that of the upper portion 295a may be formed substantially between the stepped portions 216 of the tunnel insulation layer patterns 215. For example, the air gap 295 may have a substantial hammer (or "T") shape in which the upper portion 295a and the lower portion 295b correspond to a head and a grip, respectively.

In example embodiments, a cell coupling or a parasitic capacitance occurring between the adjacent control gates 245 and/or the floating gates 225 may be reduced by the upper portion 295a of the air gap 295. Additionally, a breakdown voltage occurring when the tunnel insulation layer pattern 215 extends continuously in the first direction may be blocked by the lower portion 295b of the air gap 295, so that a leakage current may be reduced.

In some example embodiments, the depth of the air gap may be expanded to greater than that illustrated in FIG. 17.

Referring to FIG. 18, when the top surface of the substrate 200 is exposed between the tunnel insulation layer patterns 215a as illustrated in FIG. 15B, a lower portion 296b of an air gap 296 may be formed more closely to the substrate 200.

Figure 15C:
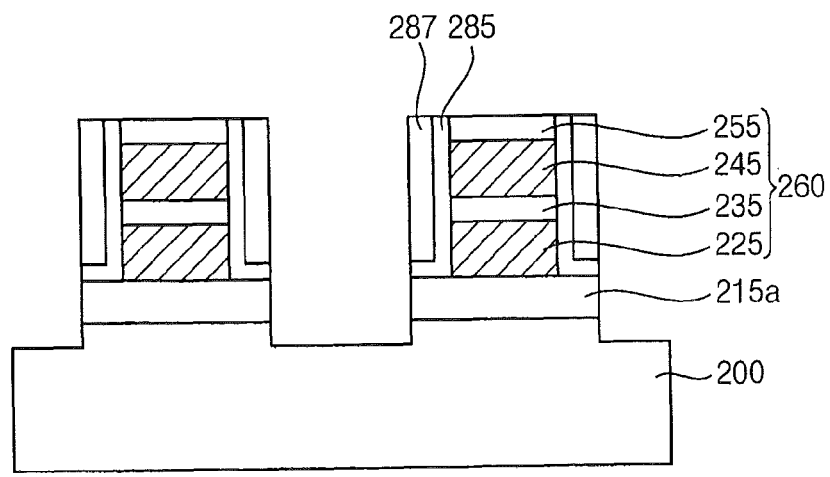

Referring to FIG. 19, when the upper portion of the substrate 200 is partially etched as illustrated in FIG. 15C, a lower portion 297b of an air gap 297 may extend beyond the upper surface of the substrate 200 beneath the gate structures 260.

In the case of FIGS. 18 and 19, the air gap between the adjacent tunnel insulation layer patterns 215 and 215a may be formed more sufficiently because the lower portion of the air gap may be expanded to the substrate 200.

The semiconductor devices according to example embodiments may be embedded in or mounted on various semiconductor packages. Further, the semiconductor devices or the semiconductor packages may be applied to various systems.

Figure 20:
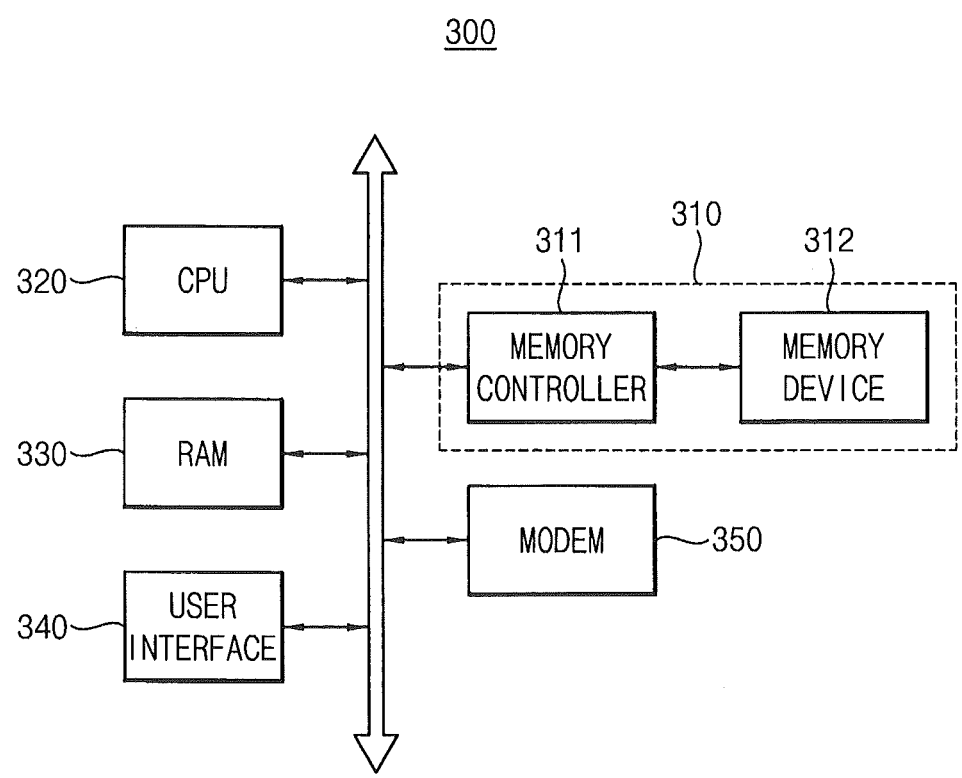

FIG. 20 is a schematic block diagram illustrating a computing system in accordance with example embodiments.

Referring to FIG. 20, a computing system 300 may include a microprocessor (CPU) 320 electrically connected to a system bus, a RAM 330, a user interface 340, a modem 350 such as a baseband chipset and a memory system 310. The memory system 310 may be, for example, a memory device 312 and a memory controller 311. The memory controller 311 may be configured to control the memory device 312. The memory system 310 may serve as, e.g., a memory card or a solid state disk (SSD) by a combination of the memory device 312 and the memory controller 311. When the computing system 300 is utilized for a mobile device, a battery may be further provided to supply an operating voltage to the computing system 300. In some example embodiments, the computing system 300 may include an application chipset, a camera image processor, a mobile DRAM device, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
   sequentially forming a dielectric layer structure and a control gate layer sequentially on a substrate;
   partially etching the control gate layer to form a plurality of control gates;
   forming a gate spacer and a sacrificial spacer sequentially stacked on a sidewall of the control gate and on a portion of the dielectric layer structure;
   partially etching the dielectric layer structure using the sacrificial spacer and the gate spacer as an etching mask to form a plurality of dielectric layer structure patterns;
   removing the sacrificial spacer; and
   forming an insulating interlayer on the substrate to form an air gap, the insulating interlayer covering the dielectric layer structure pattern, the gate spacer and the control gate, and the air gap extending between the adjacent gate spacers and between the adjacent dielectric layer structure patterns.

2. The method of claim 1, wherein the dielectric layer structure includes a tunnel insulation layer, a charge trapping layer and a blocking layer sequentially stacked on the substrate.

3. The method of claim 2, wherein partially etching the dielectric layer structure is performed until an upper portion of the tunnel insulation is removed.

4. The method of claim 2, wherein partially etching the dielectric layer structure is performed until a top surface of the substrate is exposed.

5. The method of claim 4, further comprising partially etching an upper portion of the substrate after partially etching the dielectric layer structure.

6. The method of claim 1, wherein forming the gate spacer and the sacrificial spacer includes:
   forming a gate spacer layer covering the control gates on the dielectric layer structure;
   forming a sacrificial layer on the gate spacer layer; and
   partially etching the sacrificial layer and the gate spacer layer to form the sacrificial spacer and the gate spacer, respectively, the gate spacer being formed on the sidewall of the control gate and on the portion of the dielectric layer structure, and the sacrificial spacer being formed on the gate spacer.

7. The method of claim 6, wherein partially etching the sacrificial layer and the gate spacer layer includes performing an anisotropic etching process or an etch-back process.

8. The method of claim 6, wherein the gate spacer layer is formed using silicon nitride or silicon oxynitride, and the sacrificial layer is formed using silicon oxide.

9. The method of claim 8, wherein removing the sacrificial spacer includes a wet etching process in which an etching solution having an etching selectivity for the silicon oxide is used.

10. The method of claim 1, wherein a width of the control gate is smaller than a width of a top surface of the dielectric layer structure pattern.

11. The method of claim 10, wherein the air gap includes an upper portion between the adjacent gate spacers and a lower portion between the adjacent dielectric layer structure pattern, the upper portion having a width lager than a width of the lower portion.

12. A semiconductor device, comprising:
   a plurality of dielectric layer structure patterns on a substrate;
   a control gate on a top surface of the dielectric layer structure pattern, the control gate having a width smaller than a width of the top surface of the dielectric layer structure pattern;
   a gate spacer on a sidewall of the control gate and on the top surface of the dielectric layer structure pattern; and
   an insulating interlayer covering the dielectric layer structure pattern, the control gate and the gate spacer, the insulating interlayer including an air gap therein, and the air gap including an upper portion between the adjacent gate spacers and a lower portion between the adjacent dielectric layer structure patterns,
   wherein a width of the upper portion is larger than a width of the lower portion.

13. The semiconductor device of claim 12, wherein the gate spacer has an L-shape.

14. The semiconductor device of claim 12, wherein the dielectric layer structure pattern includes a tunnel insulation layer pattern, a charge trapping layer pattern and a blocking layer pattern sequentially stacked on the substrate.

15. The semiconductor device of claim 14, wherein the tunnel insulation layer pattern has a linear shape including a plurality of stepped portions, and the charge trapping layer pattern and the blocking layer pattern are disposed on the stepped portion.

16. A non-volatile semiconductor memory device, comprising:
   a gap on a substrate, the gap including an upper gap portion and a lower gap portion between an upper surface of the substrate and the upper gap portion, the upper gap portion being wider than the lower gap portion;
   directly adjacent dielectric layer structure patterns on the substrate spaced apart from one another by the lower gap portion; and directly adjacent control gates on the directly adjacent dielectric layer structure patterns opposite the substrate, the directly adjacent control gates being spaced apart from one another by the upper gap portion.

17. The device of claim 16 further comprising:
a gate spacer on facing sidewalls of each of the directly adjacent control gates and on an uppermost surface of the dielectric layer structure pattern.

18. The device of claim 16 wherein the lower gap portion extends along facing sidewalls of the directly adjacent dielectric layer structure patterns to beyond an uppermost surface of the substrate located beneath the directly adjacent control gates.

19. The device of claim 16 wherein the gap comprises a "T" shaped air gap.

20. The device of claim 16 wherein the lower gap portion extends along facing sidewalls of the directly adjacent dielectric layer structure patterns to beyond an uppermost surface of the directly adjacent dielectric layer structure patterns located beneath the directly adjacent control gates.

\* \* \* \* \*